United States Patent

[11] 3,586,921

[72] Inventors Hiroshi Shiba; Toshio Kurosawa, both of Tokyo, Japan
[21] Appl. No. 791,714
[22] Filed Jan. 16, 1969
[45] Patented June 22, 1971
[73] Assignee Nippon Electric Company, Limited, Minato-ku Tokyo, Japan
[32] Priority Jan. 19, 1968
[33] Japan
[31] 43/3184

[54] HIGH SPEED DIFFUSION-TYPE TRANSISTOR
5 Claims, 9 Drawing Figs.

[52] U.S. Cl. .......... 317/235 R, 317/234 Q, 317/235 Z, 317/235 AL, 317/234 N
[51] Int. Cl. .......... H01l 5/02, H01l 9/12
[50] Field of Search .......... 317/235/48, 235/47.1, 234/5.4, 235/47, 235/21, 234 Q, 235 Z, 235 AL, 234 N, 235 R

[56] References Cited

UNITED STATES PATENTS

| | | | |
|---|---|---|---|
| 3,324,360 | 6/1967 | Jochems et al. .......... | 317/235 |
| 3,443,172 | 5/1969 | Koepp .......... | 317/235 |
| 3,500,143 | 3/1970 | Lamming .......... | 317/235 |
| 3,328,601 | 6/1967 | Rosenbaum .......... | 307/88.5 |

*Primary Examiner*—John W. Huckert
*Assistant Examiner*—Martin H. Edlow
*Attorney*—Hopgood and Calimafde

ABSTRACT: A diffusion formed transistor is described wherein the emitter region is selectively shaped to provide on the surface in common with the base a narrow longitudinal portion and a wide portion. The narrow portion is sized to impart a high turn on switching speed capability to the transistor and the wide portion is sized for attachment to an electrode lead.

INVENTORS
HIROSHI SHIBA
TOSHIO KUROSAWA
BY
Hopgood & Calimafde
ATTORNEYS

HIGH SPEED DIFFUSION-TYPE TRANSISTOR

This invention relates to a diffusion-type semiconductor device and, more particularly, to diffusion-formed transistors for high speed switching.

In the nonsaturated-type switching circuit, such as a current mode logic circuit, the switching speed depends on the input time constant and the cutoff frequency of the transistor. It is known that the smaller the input time constant and the higher the cutoff frequency of a transistor, the higher is the switching speed of the transistor. The input time constant of a transistor is given by the product of the base resistance and the base junction capacitance. The cutoff frequency of a transistor is determined by the distance from the emitter junction to the collector junction. In other words, the cutoff frequency is determined by the base width. If the base width is decreased so as to increase the cutoff frequency, the sheet resistance of the base region interposed between the emitter junction face and the collector junction face is remarkably increased. To reduce the base resistance, the width of the emitter region should be as narrow as possible. Also, by narrowing the emitter width, the area of the emitter junction is accordingly reduced. For the foregoing reasons, the width of the emitter region of a high speed switching transistor should be made as narrow as possible.

In a conventional transistor, the emitter region is formed within the base region, the emitter electrode is disposed in the center of the surface of the emitter region, and the base electrode is attached to the exposed surface of the base region in parallel with the emitter region. The placement of electrodes on the emitter region may be accomplished with an accuracy that has a practical limitation. As a result of this limitation, the emitter region width cannot be reduced below the space needed for the placement of an electrode.

It is therefore an object of this invention to provide a high speed switching transistor whose input time constant is small regardless of the emitter electrode structure.

It is a further object of this invention to provide a high speed diffused-type transistor.

The above-mentioned and other features and objects of this invention and the manner of attaining them will become more apparent and the invention itself will best be understood by reference to the following description of embodiments of the invention taken in conjunction with the accompanying drawings, the description of which follows.

The semiconductor device according to this invention utilizes an emitter region having a narrow region and a wide region. The emitter regions are formed within a base region. A part of the emitter wide region is exposed at the surface of the semiconductor single crystal. An oxide film covers the surface of the semiconductor device and is provided with apertures over the base region and over the emitter region for electrode connections to the regions. The aperture over the base region is located in the vicinity of the narrow width emitter region. The aperture over the emitter region is located over the wide width emitter region. With this structure, the semiconductor device of the invention is particularly suitable for application to diffused-type semiconductors.

In the semiconductor device according to this invention, two kinds of transistor operations are available because the emitter electrode contacts at the emitter wide width region and because the transistor input time constant is determined by the narrow width emitter region; hence, the switching speed is determined substantially only by the narrow width emitter region. The structure of the transistor in accordance with this invention facilitates attachment of an electrode to the emitter region without adversely affecting the high speed switching performance of the transistor.

Figure 1A:
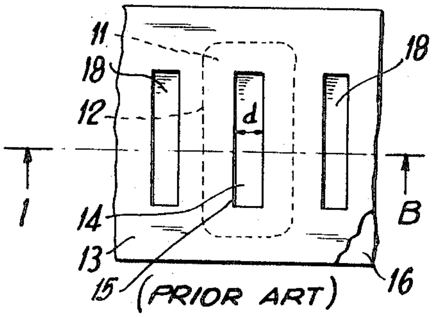
FIGS. 1A and 1B are respectively a plan view and a sectional view across a dotted line 1B of the structure of a conventional transistor.
Figure 1B:
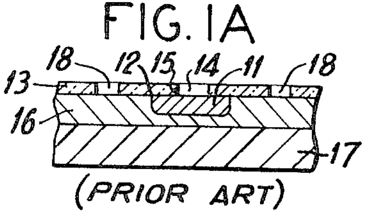

Referring to FIGS. 1A and 1B, there is provided a conventional diffused-type transistor electrode to which the electrodes are not yet attached. An opening 14 is formed in a silicon oxide film 13 through which the emitter electrode is to be connected to 14 therein and overlying an emitter region 11. The opening 14 is sized to extend over substantially the entire surface of emitter region 11, keeping a sufficient margin between the edge of the opening 14 and the emitter junction edge 12, to avoid electrical contact between the emitter electrode and the junction 12. The transistor includes the emitter region 11, a base region 16, and a collector region 17. An opening 18 is formed in the oxide film 13 through which a base electrode may be connected to the underlying base region 16. Opening 18 is longitudinal and is parallel with the emitter region 11. In the transistor structure of FIG. 1, the width of the emitter region 11 must be made wider than a minimum width determined by the resolution of photoresist material used in the manufacture of transistors. Generally, the emitter width in question is made twice as great as the distance between the emitter junction edge 12 and the edge 15 of the oxide film opening 14.

Figure 2A:
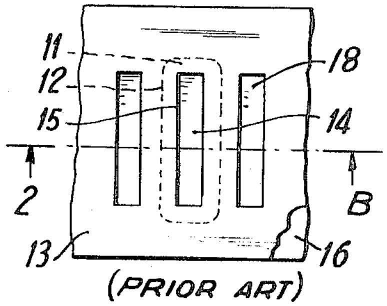
FIGS. 2A and 2B are respectively a plan view and a sectional view across a dotted line 2B of the structure of another conventional transistor.
Figure 2B:
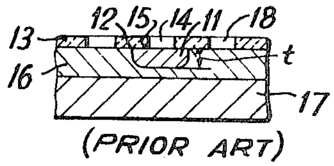

FIGS. 2A and 2B show another example of the conventional transistors. The parts common to FIG. 1 are indicated by the same reference numerals. The electrodes for the emitter and base regions are not shown installed. In this example, the emitter electrode is directly led out through the opening 14. A short circuit is often established between the electrode and the emitter junction during the electrode- attaching process, because of the short distance between the emitter junction edge 12 and the emitter electrode. Accordingly, the transistor of FIG. 2 is unstable, and it's production yield is low.

When the emitter region 11 is formed through the impurity diffusion process, the impurity diffusion occurs isotropically. As a result, the emitter junction edge 12 is located along the top surface about the same distance as the depth $t$ of the diffusion into the base region 16. Thus junction edge 12 is spaced from the end 15 of the silicon oxide film 13 by about the distance $t$.

The silicon oxide film 13 is dissolved to some extent during a surface treatment following the emitter impurity diffusion process. As a result, the opening 14 of the silicon oxide film 13 is enlarged, and the distance between the edge 15 of the opening 14 and the emitter junction edge 12 is made shorter than the depth $t$. An emitter electrode is then formed by filling a metal such as aluminum into the opening 14 to form an alloy with the emitter region 11. During this process, the metal semiconductor alloy layer somehow expands thus further decreasing the distance between the edge 15 of the opening 13 and the emitter junction edge 12. A short circuit is likely to be formed in the emitter junction. This expansion of the alloy layer is related to the alloy substance and the alloy temperature.

For example, assume that aluminum is used as an electrode material to obtain a silicon transistor whose emitter junction depth is less than 0.5 microns. Then, if the alloying step involves a heating at 300° C. for 10 minutes, a short circuit is likely to arise between the alloyed layer and the emitter junction. The 0.5 micron junction depth is often employed to achieve a high frequency operating transistor. Consequently, a short circuit often arises with the manufacture of high speed switching transistors whose emitter region depth is small.

Figure 3A:
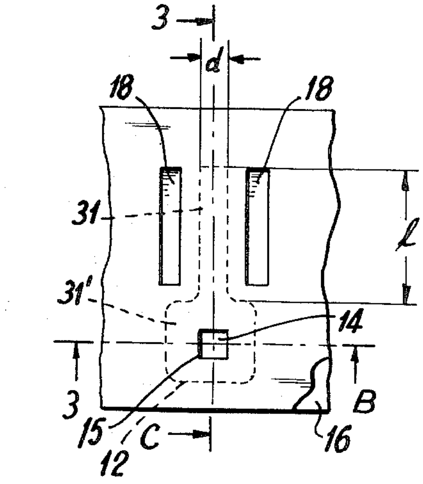
FIGS. 3A through 3C are a plan view, a sectional view across line 3B, and a sectional view across line 3C, respectively, of a preferred embodiment of this invention.
Figure 3B:
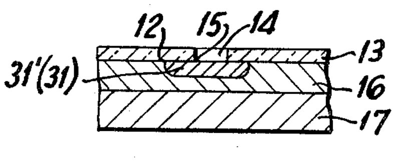
Figure 3C:
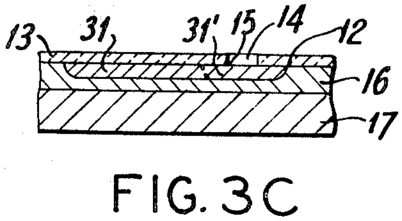

FIGS. 3A through 3C show an embodiment of this invention. The parts identical with those in FIG. 1 are indicated by common reference numerals. The emitter region of this transistor comprises a portion 31 having a minimum width as determined by the resolution of the photoresist process, and a wide width portion 31' for connection to an emitter electrode. The emitter electrode (not shown herein diagrammatically) is not connected to the narrow portion 31 but only to the wide portion 31' keeping a sufficient margin to avoid contact with the emitter junction 12. In this structure, the emitter current flows in the narrow width portion 31 of the emitter region after passage through the impurity diffusion layer of the emitter region.

The emitter series resistance presented by said diffusion layer is expressed approximately by the formula:

$$(\rho SE)\cdot(l/3d$$

where ρSE is the sheet resistance of the emitter diffusion layer; $l$ is the length of the narrow width portion; and $d$ is the width of the narrow portion.

The base resistance is expressed approximately by the formula:

$\rho SB\cdot\frac{d}{12l}$ where ρSB is the sheet resistance of the base diffused region beneath the emitter region.

When the ratio of the length $l$ to the width $d$ of the narrow portion 31 is designed to be:

$$\frac{l}{d}\ll\frac{1}{2}\sqrt{\frac{\rho SB}{\rho SE}}$$

the series resistance of the emitter can be made sufficiently small in comparison with the base resistance.

When the usual process of transistor production is employed, the sheet resistant ρSE of the emitter region is 5Ω per unit area, and that of the base region is 10KΩ per unit area. Therefore, the ratio of the length $l$ to width of the narrow portion is less than about 20. This ratio is limited below the ratio which determines the effect of the narrow portion. If necessary, the emitter region may be formed of a plurality of narrow portions and a single wide portion common to these narrow portions. This helps to reduce the emitter series resistance, thus increasing the effect of the invention. By sufficiently decreasing the emitter series resistance in said manner, the input time constant of the transistor is determined predominantly by the time constant presented by the narrow width portion 31 of the emitter region.

Since an electrode connected to the emitter contacts the latter through the aperture 14 overlying the wide emitter region a short circuit with the emitter junction 12 is avoided. This advantage is preserved even when a high speed switching transistor with a shallow depth emitter region is employed. Thus, a transistor with stable characteristics is obtained, and a high production yield can be expected. Also, the transistor of this invention is highly useful when applied to integrated circuits where such stable characteristics and high yield are very important.

The transistor response time in a current mode logic circuit is determined by the base response time, collector response time and emitter response time. The base response time does not depend on the circuit constant but is determined by the time constant of the transistor itself. The maximum switching speed of the transistor circuit is virtually determined by the base response time.

As will be understood from the foregoing, the transistor according to this invention is equivalent to two transistors connected in parallel. One of the parallel transistors has a small emitter width and the other has a large emitter width. When an input signal is applied to the base terminal of this transistor to turn the transistor from the cutoff state to the conductive state, one of the parallel transistors is rendered conducting and a current flows into the collector to provide an output response signal. The base response time is determined by the parallel transistor whose input time constant is smaller than that of the other, or in other words, the base response time is determined by the transistor whose emitter width is narrower than that of the other. When this invention is applied to the diffusion transistor, the more narrow emitter region may be made as narrow as the resolution of the photoresistive material permits. With a minimizing of the input time constant of the transistor in the aforesaid manner, the base response time is reduced to the utmost attainable by the diffusion manufacturing technique.

When the transistor is turned off, the response time is determined by the time for bringing two transistors of parallel connection into the state where there is no collector current. In this operation, therefore, the base response time is determined by the other of the parallel transistors, namely, the transistor whose input time constant is largest. In other words, the base response time from the conducting state to the cutoff state is determined by the time constant of the transistor whose emitter width is greatest.

Although the parallel transistor with the wider emitter region determines the response to cutoff, the response is still held to a short duration. This may be explained as follows. During the transition to cutoff, a great many minority carriers are in the base region. The presence of these carriers in the base region brings about a conductivity modulation, which effectively holds the sheet resistance of the base region at a sufficiently small value. At the same time, the emitter current crowding effect further aids in holding the base resistance to a small value even though the emitter width is relatively great. With both of these factors in operation during the transition to cutoff, the input time constant of the transistor is held at a sufficiently small value. In view of the foregoing, the transistor according to this invention is particularly suitable for use as a high frequency element with high switching speed capability.

Figure 4A:
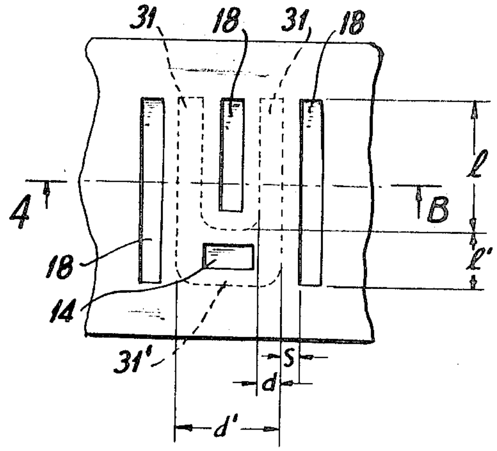
FIGS. 4A and 4B are a plan view and a sectional view across line 4B, respectively, of another embodiment of this invention.
Figure 4B:
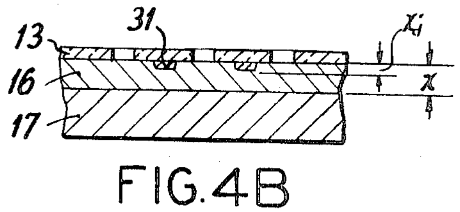

FIGS. 4A and 4B show another embodiment of this invention. The transistor of this embodiment is such that an emitter region formed in a base region 16 has the shape of a U and includes two narrow width portions 31 and the wide width portion 31' in common connection with the portions 31. The opening 18 for the base electrode is formed in parallel relationship with the narrow width portions 31. The transistor of FIG. 4 is fabricated by the conventional diffusion technique.

To mention numerical examples for FIG. 4, collector junction depth ($x$) may be 0.7 microns; emitter junction depth ($xj$), 0.5 microns; sheet resistance (ρ'SB) per unit area of the base diffusion layer, 300Ω; and sheet resistance (ρSE) per unit area of the emitter diffusion layer, 5Ω.

Referring to the plan view as in the FIG. 4, the length $l$ of the narrow portions 31 of the emitter region is 30 microns and its width $d$ is 2 microns, and the length $l'$ of the wide portion 31' is 10 microns and its width $d'$ is 16 microns. Furthermore, the interspace δ between the emitter region and the opening 18 of the base electrode is 4 microns.

The switching speed of the transistor of the numerical example is six times as high as that of the conventional transistor as shown in FIG. 1 of like power dissipation as that of the transistor of the example. The switching speed may be approximated by the following formula in terms of the base resistance $r_B$ of the two narrow portions of linear shape:

$$r_B=\frac{1}{2}\left(\rho SB\cdot\frac{d}{12l}+\rho'_{SB}\cdot\frac{\delta}{2l}\right)$$

wherein the sheet resistance $\rho_{SB}$ per unit areas of the base diffusion layer beneath the emitter region is about $2\times10^4\Omega$, based on said junction depth. Hence, the base resistance of the transistor according to the example is 65Ω calculated from said equation.

On the other hand, in the prior art transistor of FIG. 1, the width of the opening for the emitter electrode must be about 2 microns, the distance from the edge 15 of this opening to the junction edge 12 must be about 3 microns. Therefore, the width of the emitter region is at least about 8 microns. With such dimensions, the length of the emitter region of the conventional transistor should be 35 microns if the area of the emitter region should be equal to that of the transistor of said example (280 microns squared). Yet, the calculated base resistance value of this conventional transistor is about 400Ω.

Comparing the two calculated base resistances, it becomes obvious that the base response time of the transistor of this invention can be reduced by a factor of six in comparison with a transistor of the prior art. Thus, it is expected that the average signal delay time can be reduced to about 2 nanoseconds.

While a few embodiments of the invention have been explained in detail it is to be understood that the invention will not be confined to the transistor of diffusion type but is applicable to all semiconductor devices as defined in the appended claims.

We claim:

1. A high speed transistor of the diffusion type comprising
a semiconductor single crystal substrate, a collector region formed in said substrate, a base region formed in said collector region, and an emitter region formed in said base region, said base and said emitter region terminating on a common surface of said substrate, said emitter region being shaped to include a wide portion on said surface and a narrow elongated portion on said surface communicating at one end with said wide portion, and an emitter electrode connected only to said wide portion, to impart a high switching speed capability to the transistor
wherein said narrow portion has a length $l$ and a width $d$ and wherein the ratio of said length and width is selected according to the relationship $$\frac{l}{d} \ll \frac{1}{2}\sqrt{\frac{\rho SB}{\rho SE}}$$

where $\rho_{SB}$ is said base sheet resistance beneath the emitter region and where $\rho_{SE}$ is the sheet resistance of said emitter region.

2. The device as recited in claim 1 wherein a plurality of narrow longitudinal emitter portions are connected to said wide emitter portion and wherein of said each narrow portions has a length bearing a preselected ratio to its width.

3. The device as recited in claim 2, wherein said emitter region is shaped in the form of a U with the arms of said U defining said narrow portions and the base of said U defining said wide portion.

4. The device as recited in claim 1 and further including an insulative layer formed over said surface and provided with a base aperture, and an emitter aperture located over said wide emitter portion, said apertures being sized to receive electrode leads for connection to exposed semiconductor regions.

5. The device as recited in claim 4 wherein said base aperture extends in substantially parallel relationship along the narrow emitter region at a selected distance therefrom.